United States Patent
Lee et al.

(10) Patent No.: US 12,125,685 B2
(45) Date of Patent: Oct. 22, 2024

(54) PLASMA PROCESSING APPARATUS

(71) Applicant: SAMSUNG ELECTRONICS CO., LTD., Suwon-si (KR)

(72) Inventors: Jun Soo Lee, Seoul (KR); Yoshihisa Hirano, Suwon-si (JP); Jae Hoon Kim, Seoul (KR); Young Jin Noh, Ansan-si (KR); Sung Moon Park, Seongnam-si (KR); Seung Kyu Lim, Seoul (KR); Kyeong Seok Jeong, Hwaseong-si (KR); Hyung Kyu Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/975,012

(22) Filed: Oct. 27, 2022

(65) Prior Publication Data

US 2023/0047219 A1 Feb. 16, 2023

Related U.S. Application Data

(63) Continuation-in-part of application No. 16/596,945, filed on Oct. 9, 2019, now abandoned.

(30) Foreign Application Priority Data

Feb. 11, 2019 (KR) .................. 10-2019-0015640

(51) Int. Cl.
   *H01J 37/32* (2006.01)
(52) U.S. Cl.
   CPC .. *H01J 37/32642* (2013.01); *H01J 37/32091* (2013.01)

(58) Field of Classification Search
   CPC ............ C23C 16/4404; H01J 37/32091; H01J 37/32477; H01J 37/32495; H01J 37/32642; H01J 2237/2001; H01L 21/3065; H01L 21/67069; H01L 21/67103; H01L 21/6831; H01L 21/68735
   See application file for complete search history.

(56) References Cited

U.S. PATENT DOCUMENTS

| 5,556,500 | A    | 9/1996 | Hasegawa et al. |
| 6,344,105 | B1 * | 2/2002 | Daugherty ........ H01L 21/68735 |
|           |      |        | 156/915 |

(Continued)

FOREIGN PATENT DOCUMENTS

| JP | 2011-108764 A | 6/2011 |
| KR | 10-0743872 B1 | 7/2007 |

(Continued)

OTHER PUBLICATIONS

Office Action issued on Nov. 21, 2023 by the Korean Patent Office in corresponding KR Patent Application No. 10-2019-0015640.

*Primary Examiner* — Benjamin Kendall
(74) *Attorney, Agent, or Firm* — Sughrue Mion, PLLC (57) ABSTRACT

A plasma processing apparatus may include a lower electrode supporting a wafer; a focus ring surrounding an edge of the lower electrode and having a ring shape; and an edge ring disposed in a position lower than a position of the focus ring. The focus ring may include a lower region and an upper region disposed on the lower region, and the upper region increases in electrical conductivity as the upper region is closer to the lower region.

14 Claims, 7 Drawing Sheets

(56) References Cited

U.S. PATENT DOCUMENTS

| | | | |
|---|---|---|---|
| 6,391,787 B1* | 5/2002 | Dhindsa | H01J 37/3244 |
| | | | 118/723 R |
| 6,554,954 B2 | 4/2003 | Ma et al. | |
| 7,244,336 B2 | 7/2007 | Fischer et al. | |
| 7,882,800 B2* | 2/2011 | Koshiishi | H01J 37/32642 |
| | | | 156/915 |
| 9,997,381 B2 | 6/2018 | McMillin et al. | |
| 2003/0000648 A1* | 1/2003 | Park | H01J 37/32642 |
| | | | 156/345.51 |
| 2004/0002221 A1 | 1/2004 | O'Donnell et al. | |
| 2004/0255868 A1 | 12/2004 | AmRhein et al. | |
| 2013/0026693 A1* | 1/2013 | Ranish | H01L 21/68735 |
| | | | 269/305 |
| 2013/0107415 A1 | 5/2013 | Banna et al. | |
| 2013/0186858 A1 | 7/2013 | Suzuki et al. | |
| 2016/0343547 A1 | 11/2016 | Lim et al. | |
| 2017/0032987 A1 | 2/2017 | Lee et al. | |
| 2017/0053820 A1 | 2/2017 | Bosch et al. | |
| 2017/0301578 A1 | 10/2017 | Hong et al. | |
| 2018/0005832 A1* | 1/2018 | Liao | H01L 21/3065 |
| 2020/0043757 A1 | 2/2020 | Kim | |
| 2020/0063269 A1 | 2/2020 | Lee | |
| 2020/0411296 A1 | 12/2020 | Kang | |

FOREIGN PATENT DOCUMENTS

| | | |
|---|---|---|
| KR | 10-2008-0029569 A | 4/2008 |
| KR | 10-2017-0014384 A | 2/2017 |

* cited by examiner

PLASMA PROCESSING APPARATUS

CROSS-REFERENCE TO RELATED APPLICATION

This application is Continuation of U.S. application Ser. No. 16/596,945, filed on Oct. 9, 2019, which is based on and claims priority under 35 U.S.C. § 119 to Korean Patent Application No. 10-2019-0015640 filed on Feb. 11, 2019 in the Korean Intellectual Property Office, the disclosures of which are incorporated herein by reference in their entireties.

BACKGROUND

The disclosure relates to a plasma processing apparatus.

Generally, a semiconductor device is manufactured through a plurality of unit processes including a thin film deposition process, a dry etching process, or the like. The dry etching process is mainly performed in a semiconductor manufacturing apparatus in which a plasma reaction is induced. With the miniaturization and high integration of semiconductor products, the characteristics of manufactured semiconductor devices have increasingly been influenced by non-uniformities of the dry etching process.

SUMMARY

An aspect of the disclosure is to provide a plasma processing apparatus in which an incident angle of ions in an edge region of a wafer may be kept substantially constant even when a focus ring is consumed.

In accordance with an aspect of the disclosure, a plasma processing apparatus includes a lower electrode configured to support a wafer on an upper surface of the lower electrode; a focus ring surrounding an edge of the lower electrode and having a ring shape; and an edge ring disposed in a position lower than a position of the focus ring, wherein the focus ring includes a lower region and an upper region disposed on the lower region, wherein an electrical conductivity of a first portion of the upper region is smaller than an electrical conductivity of a second portion of the upper region that is closer to the lower region than the first portion.

The first portion may include a first layer and the second portion may include a second layer, and the second layer may be stacked on the lower region and the first layer is stacked on the second layer.

The first layer and the second layer may include a same semiconductor material, and a dopant concentration of the second layer may be larger than a dopant concentration of the first layer.

The semiconductor material may include silicon or silicon carbide.

The first layer may include a first semiconductor material and the second layer may include a second semiconductor material different from the first semiconductor material.

An electrical conductivity of the upper region may gradually increase from a first side of the upper region to a second side of the upper region that is closer to the lower region than the first side.

The upper region may include a semiconductor material, and a dopant concentration in the upper region may gradually increase from the first side to the second side.

An electrical conductivity of the lower region may be greater than a maximum electrical conductivity of the upper region.

A boundary between the lower region and the upper region may be located higher than an upper surface of the lower electrode.

The upper region may include a side surface adjacent to the wafer, the side surface having a slope such that the side surface is not perpendicular to the upper surface of the lower electrode.

In accordance with an aspect of the disclosure, a plasma processing apparatus includes a process chamber; a lower electrode disposed in the process chamber, an upper surface of the lower electrode being configured to support a wafer; a focus ring surrounding an upper edge of the lower electrode; and an edge ring surrounding a lower edge of the lower electrode and supporting the focus ring, wherein the focus ring includes a lower region and an upper region disposed on the lower region, wherein an electrical conductivity of a first portion of the upper region is smaller than an electrical conductivity of a second portion of the upper region that is closer to the lower region than the first portion, and wherein the lower region has a greater electrical conductivity than a maximum electrical conductivity of the upper region.

The first portion may include a first layer stacked on the lower region and the second portion may include a second layer stacked on the first layer.

The first layer and the second layer may include a same semiconductor material, a dopant concentration of the second layer may be larger than a dopant concentration of the first layer, and a dopant concentration of the lower region may be greater than a maximum dopant concentration of the upper region.

The first layer may include a first semiconductor material and the second layer may include a second semiconductor material different from the first semiconductor material.

An electrical conductivity of the upper region may gradually increase from a first side of the upper region to a second side of the upper region that is closer to the lower region than the first side.

The upper region and the lower region may include a same semiconductor material, a dopant concentration in the upper region may gradually increase from the first side to the second side, and the lower region may have a greater dopant concentration than a maximum dopant concentration of the upper region.

A boundary between the lower region and the upper region may be located higher than the upper surface of the lower electrode, and may be located lower than an upper surface of the wafer.

In accordance with an aspect of the disclosure, a plasma processing apparatus includes a process chamber; a lower electrode disposed in the process chamber, an upper surface of the lower electrode being configured to support a wafer; a focus ring surrounding an upper edge of the lower electrode, the focus ring including a semiconductor material; an insulation ring surrounding an outer peripheral surface of the focus ring, the insulation ring including an insulating material; and an edge ring disposed in a position lower than a position of the focus ring and a position of the insulation ring, wherein the focus ring includes a lower region and an upper region disposed on the lower region, wherein an electrical conductivity of a first portion of the upper region is smaller than an electrical conductivity of a second portion of the upper region that is closer to the lower region than the first portion, and wherein the lower region has a greater electrical conductivity than a maximum electrical conductivity of the upper region.

The first portion may include a first layer and the second portion may include a second layer, the first layer and the second layer may include a same semiconductor material, and a dopant concentration in the first layer may be smaller than a dopant concentration in the second layer.

An electrical conductivity of the upper region may gradually increase from a first side of the upper region to a second side of the upper region that is closer to the lower region than the first side, and a dopant concentration in the first portion may be smaller than a dopant concentration in the second portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, a plasma processing apparatus according to embodiments of the disclosure will be described with reference to the accompanying drawings.

Figure 1:
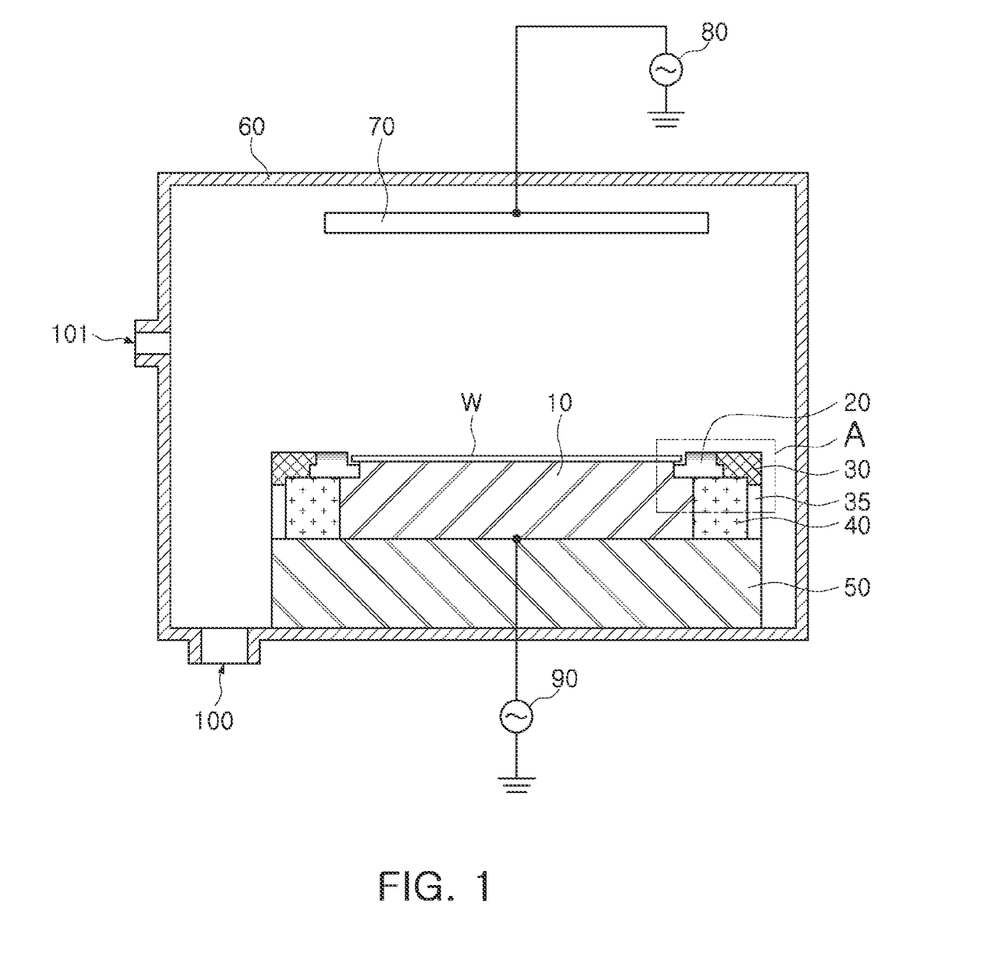
FIG. 1 is a schematic view of a plasma processing apparatus according to an embodiment.

FIG. 1 is a schematic view of a plasma processing apparatus according to an embodiment.

Figure 2:
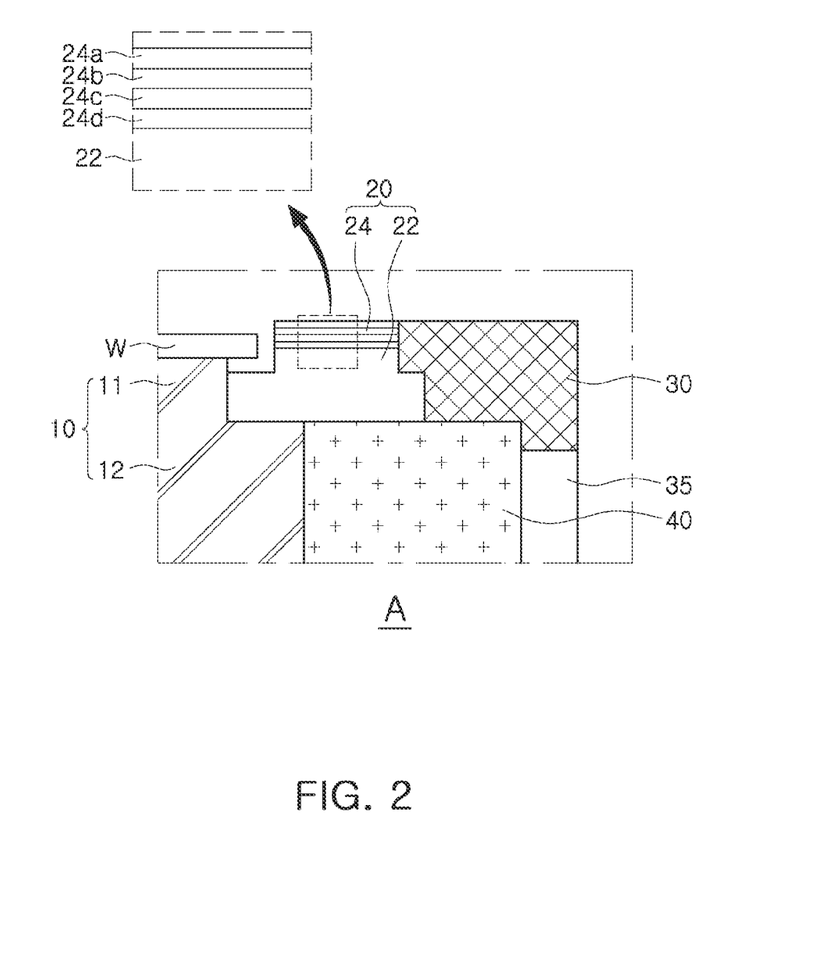
FIG. 2 is an enlarged view of 'A' region of FIG. 1.

Referring to FIGS. 1 and 2, a plasma processing apparatus according to an embodiment may include a process chamber 60, a lower electrode 10 disposed in the process chamber 60 and supporting a wafer W on an upper surface of the lower electrode 10, an edge ring 40 surrounding the lower electrode 10, a focus ring 20 disposed on the edge ring 40, an insulation ring 30 surrounding the focus ring 20, an isolator 50 disposed in a position lower than a position of the lower electrode 10 and the edge ring 40, an upper electrode 70 disposed above the lower electrode 10 to face the lower electrode 10, and the like. Here, the terms "upper", "lower", "higher", "above", etc. may be defined such that an element that is "lower" than another element is positioned closer to the isolator 50 than the other element. Similarly, an element that is "higher" than or "above" another element may be positioned closer to the upper electrode 70 than the other element.

The lower electrode 10 may support an object to be processed, e.g., the wafer W. For example, the lower electrode 10 may be an electrostatic chuck. For example, the lower electrode 10 may produce an electrostatic force to position the wafer W on the lower electrode 10.

The lower electrode 10 may have a shape similar to that of the wafer W. For example, an upper surface of the lower electrode 10 may be formed to have a circular shape. As shown in FIG. 2, the lower electrode 10 may include an upper portion 11 facing the wafer W, and a lower portion 12 facing the isolator 50. A diameter of the lower portion 12 of the lower electrode 10 may be different from a diameter of the upper portion 11 of the lower electrode 10. For example, the diameter of the lower portion 12 of the lower electrode 10 may be greater than the diameter of the upper portion 11 of the lower electrode 10. In this case, a side surface of the lower electrode 10 may have a step difference according to the difference in diameter between the upper portion 11 an the lower portion 12. The disclosure is not limited thereto, and the diameter of the upper portion 11 of the lower electrode 10 may be the same as the diameter of the lower portion 12 of the lower electrode 10.

The wafer W may completely cover the upper portion 11 of the lower electrode 10. A portion of the wafer W may protrude beyond an edge of the upper portion 11 of the lower electrode 10 in a radial direction. For example, a diameter of the upper portion 11 of the lower electrode 10 may be smaller than a diameter of the wafer W. This configuration may prevent the lower electrode 10 from being damaged when the wafer W is subject to a plasma treatment process, for example, a dry etching process. An upper surface of the wafer W may be exposed to plasma, but the upper surface of the lower electrode 10 may not be exposed to plasma.

The lower electrode 10 may support a lower surface of the wafer W, and may cool the wafer W on which the plasma treatment process is performed, at the same time. When ions in the plasma are supplied to the wafer W, a surface of the wafer W may be etched, and a surface temperature of the wafer W may rise sharply, at the same time. When the surface temperature of the wafer W increases excessively, the wafer W may be deformed or damaged. In order to prevent this, the lower electrode 10 may have a channel through which a coolant flows, and the coolant may flow through the channel to control the surface temperature of the wafer W disposed on the lower electrode 10. As the coolant, for example, helium (He) or the like may be used, but it is not limited thereto.

The focus ring 20 may be disposed to surround an edge of the wafer W. The focus ring 20 may surround a portion of the lower electrode 10 on which the wafer W is disposed. For example, the focus ring 20 may have a ring shape surrounding the upper portion 11 of the lower electrode 10. A portion of the focus ring 20 may be disposed in a position lower than a position of the edge of the wafer W, and may cover a side surface of the upper portion 11 of the lower electrode 10. In other words, a portion of the focus ring 20 may be positioned underneath the protruding edge of the wafer W. The portion of the focus ring 20 may contact the side surface of the upper portion 11 of the lower electrode 10. At the same time, the focus ring 20 may cover at least a portion of an upper surface of the lower portion 12 of the lower electrode 10. The focus ring 20 may prevent the lower electrode 10 from being damaged in the plasma treatment process.

When the focus ring 20 includes, for example, an electrically conductive material, the focus ring 20 may have properties of an electrode. When radio frequency (RF) power is applied to the lower electrode 10 and/or the upper electrode 70 to form an electric field, the focus ring 20 may function to expand a formation region of the electric field to uniformly process the wafer W. Further, the focus ring 20 may function to confine a formation region of the plasma within a specific region.

The focus ring 20 may be made of a semiconductor material such as, for example, silicon (Si), silicon carbide (SiC), gallium arsenide (GaAs), or the like. Since the focus ring 20 may be directly exposed to the plasma during the plasma treatment process, an upper portion of the focus ring 20 may be etched as the plasma treatment process is repeated. As the plasma treatment process is repeated, a level of the upper surface of the focus ring 20 may be gradually lowered.

In an embodiment of the disclosure, the focus ring 20 may include a lower region 22 and an upper region 24 disposed on the lower region 22, wherein the upper region 24 may increase in electrical conductivity as the upper region is closer to the lower region 22. In other words, an electrical conductivity of a first portion of the upper region 24 may be smaller than an electrical conductivity of a second portion of the upper region 24 that is closer to the lower region 22 than the first portion. The upper region 24 of the focus ring 20 may include a plurality of layers, stacked on the lower region 22, in which electric conductivity increases discontinuously as the upper region is closer to the lower region 22. In other words, the upper region 24 may include a first layer and a second layer, and the second layer may be stacked on the lower region 22 and the first layer may be stacked on the second layer. The upper region 24 may include a first upper layer 24a, a second upper layer 24b, a third upper layer 24c, and a fourth upper layer 24d, sequentially increasing in electrical conductivity. In FIG. 2, the upper region 24 is illustrated as consisting of four (4) layers having different electrical conductivities, but the disclosure is not limited to that illustrated in FIG. 2. For example, the upper region 24 may include five (5) or more layers having different electrical conductivities. For example, the upper region 24 may include two (2) layers or three (3) layers having different electrical conductivities. Electrical conductivity of the lower region 22 may be greater than a maximum electrical conductivity of the upper region 24. For example, electrical conductivities of the first upper layer 24a, the second upper layer 24b, the third upper layer 24c, and the fourth upper layer 24d may range from 0.005 to 0.01 ohm-1 cm-1, and electrical conductivity of the lower region 22 may range from 0.05 to 1 ohm-1 cm-1. However, the electrical conductivities of the first upper layer 24a, the second upper layer 24b, the third upper layer 24c, and the fourth upper layer 24d, and the electrical conductivity of the lower region 22 are not limited to the above-described ranges.

The first upper layer 24a, the second upper layer 24b, the third upper layer 24c, and the fourth upper layer 24d may be made of the same semiconductor material, and dopant concentrations of the first upper layer 24a, the second upper layer 24b, the third upper layer 24c, and the fourth upper layer 24d may increase as the first upper layer 24a, the second upper layer 24b, the third upper layer 24c, and the fourth upper layer 24d are closer to the lower region 22. In other words, an upper layer that is closer to the lower region 22 may have a dopant concentration higher than that of an upper layer that is farther from the lower region 22. The lower region 22 may be made of the same semiconductor material as the upper region 24, and a dopant concentration of the lower region 22 may be greater than a maximum dopant concentration of the upper region 24. A dopant concentration of the lower region 22 may be greater than a dopant concentration of the fourth upper layer 24d which is shown in FIG. 2 as being closest to the lower region 22. The focus ring 20 may be made of, for example, silicon carbide (SiC), and the dopant may be nitrogen (N), phosphorus (P), boron (B), or the like. Alternatively, the focus ring 20 may be made of, for example, silicon (Si), and the dopant may be arsenic (As), phosphorus (P), boron (B), aluminum (Al), or the like.

The first upper layer 24a, the second upper layer 24b, the third upper layer 24c, and the fourth upper layer 24d may be made of different semiconductor materials, and the electrical conductivities of the first upper layer 24a, the second upper layer 24b, the third upper layer 24c, and the fourth upper layer 24d may increase as the first upper layer 24a, the second upper layer 24b, the third upper layer 24c, and the fourth upper layer 24d are closer to the lower region 22. The lower region 22 may be made of a semiconductor material having a greater electrical conductivity than the fourth upper layer 24d.

A boundary between the lower region 22 and the upper region 24 of the focus ring 20 may be located higher than the upper surface of the lower electrode 10. The boundary between the lower region 22 and the upper region 24 of the focus ring 20 may be located lower than the upper surface of the wafer W. Side surfaces of the upper region 24 of the focus ring 20 may be perpendicular to the upper or lower surface of the focus ring 20.

A plasma processing apparatus according to an embodiment of the disclosure may employ a focus ring 20, such that an incident angle of ions in an edge region of a wafer W may be maintained substantially constant even as the focus ring 20 is consumed. This will be described later with reference to FIGS. 5 to 9.

An insulation ring 30 may have a ring shape to surround an outer peripheral surface of the focus ring 20. The insulation ring 30 may include a different material than the focus ring 20. More specifically, the insulation ring 30 may include a material that may have etching resistance in an etching process using plasma. In addition, the insulation ring 30 may include an insulating material. For example, when the focus ring 20 includes silicon, the insulation ring 30 may include quartz.

An edge ring 40 may have a ring shape surrounding a lower portion 12 of a lower electrode 10. The edge ring 40 may be disposed in a position lower than a position of the focus ring 20 and the insulation ring 30, and may support the focus ring 20 and the insulation ring 30. The edge ring 40 may include a metallic material. More specifically, the edge ring 40 may include aluminum, but the disclosure is not limited thereto.

Since the focus ring 20 may be directly exposed to plasma during a plasma treatment process for a wafer W, a temperature of the focus ring 20 may increase. As described above, a channel through which a coolant for cooling the wafer W flows may be formed in the lower electrode 10. By using this, an increase in temperature of the wafer W during the plasma process may be controlled, but an upper surface of the focus ring 20 may not be cooled. The upper surface of the focus ring 20 may therefore have a different temperature from a surface of the wafer W, and an imbalance may occur in the plasma provided to surfaces of the wafer W and the focus ring 20. Plasma may also be provided on an upper surface of the insulation ring 30 during the plasma treatment process for the wafer W. A temperature of the insulation ring 30 provided with the plasma may increase. When the insulation ring 30 is heated, an imbalance between a heated temperature of the insulation ring 30 and a temperature of an upper surface of the wafer W may occur in a manner similar to that of the focus ring 20, and an imbalance may occur in the plasma supplied to surfaces of the wafer W and the insulation ring 30. Therefore, a channel of a coolant may be further included in the edge ring 40 to cool the focus ring 20 and the insulation ring 30 in a manner similar to that of the channel of the coolant in the lower electrode 10 for cooling the wafer W.

The insulation ring 30 may also be supported by a support ring 35. The support ring 35 may contact a portion of a lower surface of the insulation ring 30. As illustrated in FIG. 1, the support ring 35 may be disposed to surround an outer peripheral surface of the edge ring 40. The support ring 35 may block the plasma from being provided to a side portion of the edge ring 40. The support ring 35 may include materials having etching resistance to plasma etching gas, and may include, for example, quartz, but is not limited thereto. The support ring 35 may contact at least a portion of an isolator 50, and may also be supported by the isolator 50.

The isolator 50 may be disposed in a position lower than a position of the lower electrode 10, the edge ring 40, and the support ring 35. The isolator 50 may support the lower electrode 10, the edge ring 40, and the support ring 35. The isolator 50 may include an insulating material, and may include, for example, a ceramic.

An upper electrode 70 may be disposed in a process chamber 60 to face the lower electrode 10.

RF power may be applied to the lower electrode 10 by a second power source 90 during the plasma treatment process using a plasma processing apparatus according to an embodiment. The upper electrode 70 may receive RF power from a first power source 80, and may be synchronized with the lower electrode 10, to excite source gas supplied to the process chamber 60 to form plasma.

A plasma processing apparatus according to an embodiment may include a processing chamber 60 that provides a space for performing a plasma treatment process for the wafer W, for example, a dry etching process.

The process chamber 60 may include an inlet 101 and an outlet 100, which may be selectively opened and closed under control. The source gas used in the plasma treatment process may be supplied to the process chamber 60 through the inlet 101. A by-product generated by the plasma treatment process may be discharged through the outlet 100. In FIG. 1, a single inlet 101 and a single outlet 100 are illustrated as being formed in the process chamber 60, respectively, but the disclosure is not limited thereto. The process chamber 60 may include a plurality of inlets 101 and outlets 100, respectively.

Figure 3:
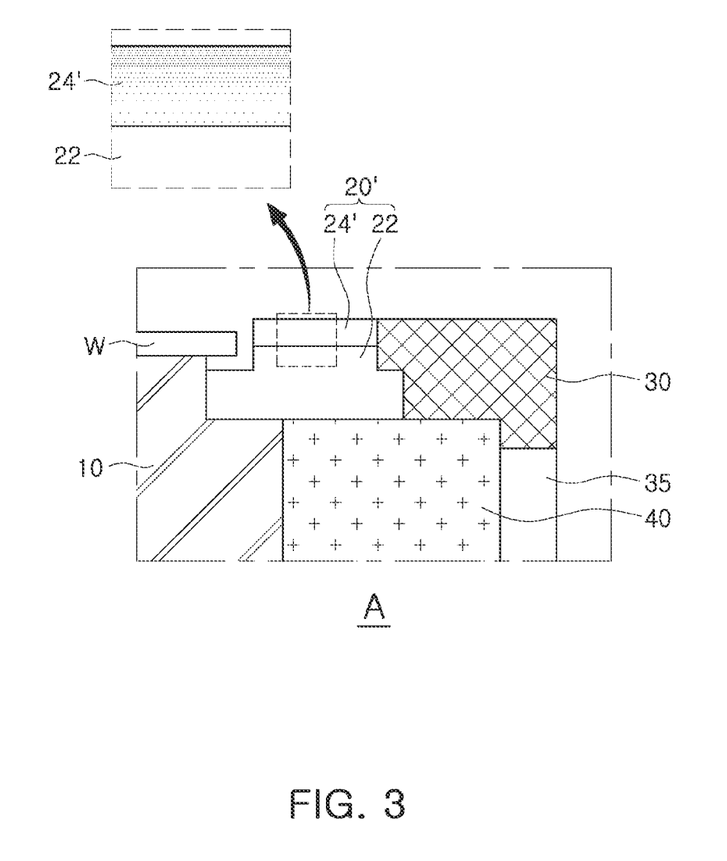
FIGS. 3 and 4 are views illustrating a plasma processing apparatus according to embodiments.
Figure 4:
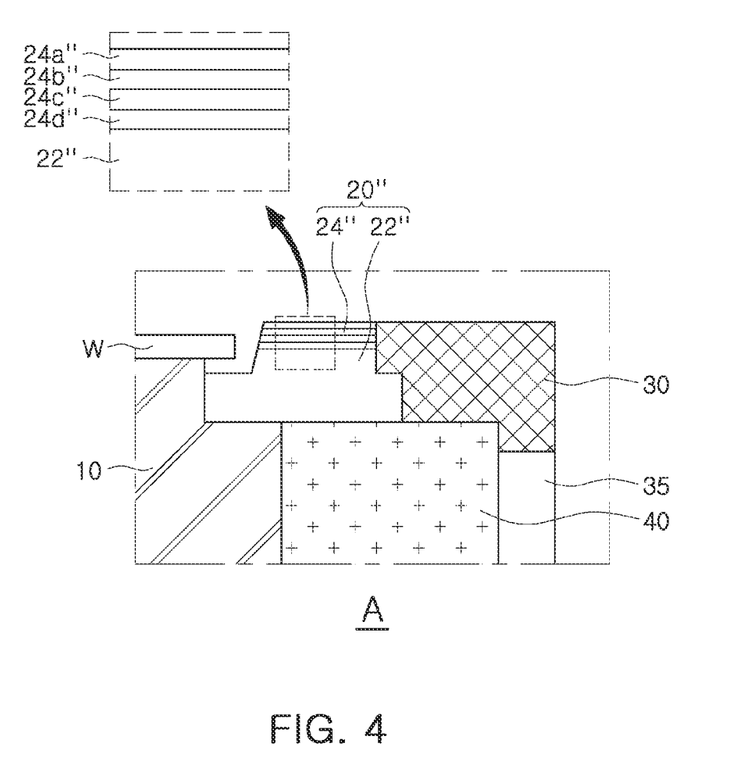

FIGS. 3 and 4 are views illustrating a plasma processing apparatus according to embodiments of the disclosure. Since focus rings illustrated in FIGS. 3 and 4 are similar to a focus ring illustrated in FIG. 2, only the differences between FIGS. 3 and 4, and FIG. 2 will be described below.

Referring to FIG. 3, a focus ring 20' may be made of a semiconductor material such as, for example, silicon (Si), silicon carbide (SiC), or gallium arsenide (GaAs).

The focus ring 20' may include a lower region 22 and an upper region 24' disposed on the lower region 22, wherein the electrical conductivity of the upper region 24' may increase toward to the lower region 22. The electric conductivity of the upper region 24' of the focus ring 20 may gradually increase toward to the lower region 22.

The upper region 24' may be made of a single semiconductor material, and a dopant concentration in the upper region may gradually increase toward to the lower region 22. The lower region 22 may be made of the same semiconductor material as the upper region 24', and a dopant concentration in the lower region 22 may be greater than a maximum dopant concentration of the upper region 24'. The focus ring 20' may be made of, for example, silicon carbide (SiC), and the dopant may be nitrogen (N), phosphorus (P), boron (B), or the like. Alternatively, the focus ring 20' may be made of, for example, silicon (Si), and the dopant may be arsenic (As), phosphorus (P), boron (B), aluminum (Al), or the like.

Referring to FIG. 4, in a different manner to FIG. 2, a side surface of an upper region 24" of a focus ring 20" adjacent to a wafer W may have a slope relative to an upper or lower surface of the focus ring 20". In other words, the side surface of the upper region 24" may not be perpendicular to the upper or lower surface of the focus ring 20". A width of the upper region 24" may become smaller as the upper region is further away from a lower region 22". A portion of the lower region 22" adjacent the upper region 24" may also have a sloped side surface. Widths of a first upper layer 24a", a second upper layer 24b", a third upper layer 24c", and a fourth upper layer 24d" may become smaller as the upper region is further away from the lower region 22". In an embodiment, in a different manner to that illustrated in FIG. 4, a side surface of the upper region 24" of the focus ring 20" adjacent to an insulation ring 30 may be sloped with respect to an upper or lower surface of the focus ring 20", and a side surface of the upper region 24" of the focus ring 20" adjacent to the wafer W may not have a slope with respect to an upper or lower surface of the focus ring 20". In this case, a width of the upper region 24" may become smaller as the upper region is further away from the lower region 22". In an embodiment, in a different manner to that illustrated in FIG. 4, both the side surface of the upper region 24" of the focus ring 20" adjacent to the wafer W and the side surface of the upper region 24" of the focus ring 20" adjacent to the insulation ring 30 may be sloped with respect to an upper or lower surface of the focus ring 20". In this case, a width of the upper region 24" may become smaller as the upper region is further away from the lower region 22".

FIGS. 5 to 9 are views illustrating simulation results of an embodiment and a comparative example.

Figure 5:
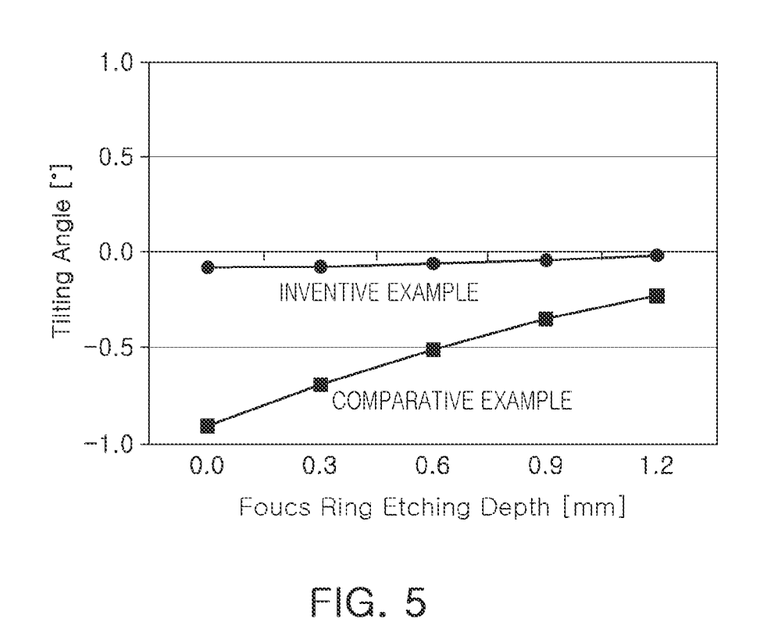
FIGS. 5 to 9 are views illustrating simulation results of an embodiment and a comparative example.

FIG. 5 illustrates changes in a tilting angle of ions incident on an edge portion of a wafer, depending on an etching depth of a focus ring, with respect to an embodiment and a comparative example.

Referring to FIG. 5, in a case of a comparative example employing a focus ring 22' (see FIGS. 8 and 9) having a single electrical conductivity, as an etching depth of the focus ring 22' increases, a tilting angle of ions may change greatly. In a case of an embodiment in which a focus ring 20 (see FIGS. 6 and 7) made up of an upper region 24 and a lower region 22 including a plurality of layers having different electric conductivities is employed, it can be seen that a tilting angle of ions may be maintained almost constant even when an etching depth of the focus ring 20 increases. A negative (−) value of the tilting angle means that ions are sloped obliquely in a direction from a central portion of a wafer toward an edge portion of a wafer. Meanwhile, a positive (+) value of the tilting angle means that ions incident on an edge portion of a wafer are sloped obliquely in a direction from the edge portion of the wafer toward the central portion of the wafer.

Figure 6:
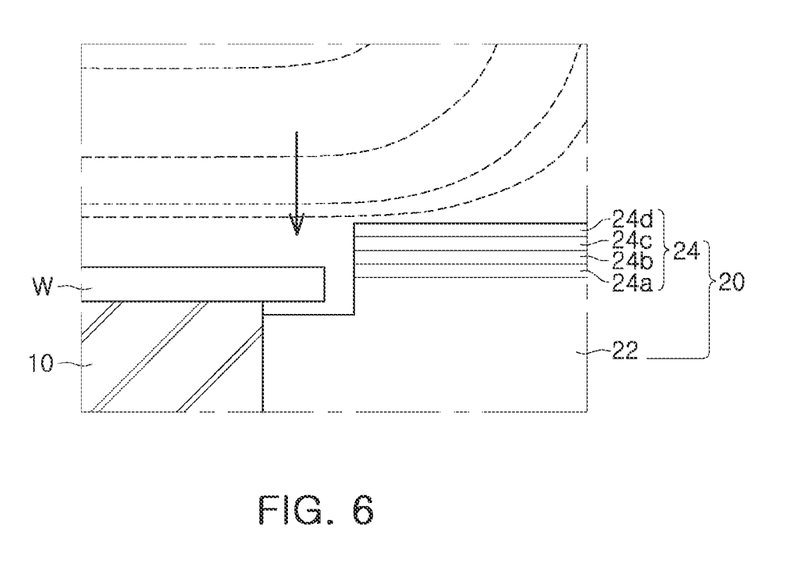

FIG. 6 illustrates a case in which a focus ring 20 including an upper region 24 and a lower region 22 including a plurality of layers having different electrical conductivities according to an embodiment is used, and a simulation result for a state in which an etching depth of the focus ring 20 is 0 mm, for example, an initial state of the focus ring 20. Equipotential lines indicated by dotted lines may be uniformly formed without being distorted near the focus ring 22, and may be substantially parallel to an upper surface of a wafer W across the upper surface of the wafer W and at an edge portion of the wafer W. As a result, ions incident on the edge portion of the wafer W may be incident at an angle of about (−) 0.1 degrees.

Figure 7:
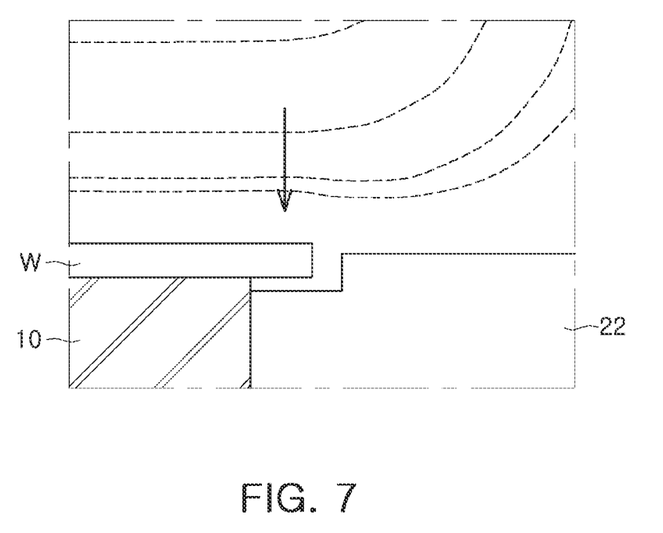

FIG. 7 illustrates a case in which a focus ring 20 including an upper region 24 and a lower region 22 according to an embodiment is used, and a simulation result for a state in which an etching depth of the focus ring 20 is 1.2 mm. The upper region 24 of the focus ring 20 may be completely etched, and equipotential lines may be still substantially parallel to an upper surface of a wafer W across the upper surface of the wafer W and at an edge portion of the wafer W. As a result, ions incident on the edge portion of the wafer W may be incident in an almost vertical direction.

Figure 8:
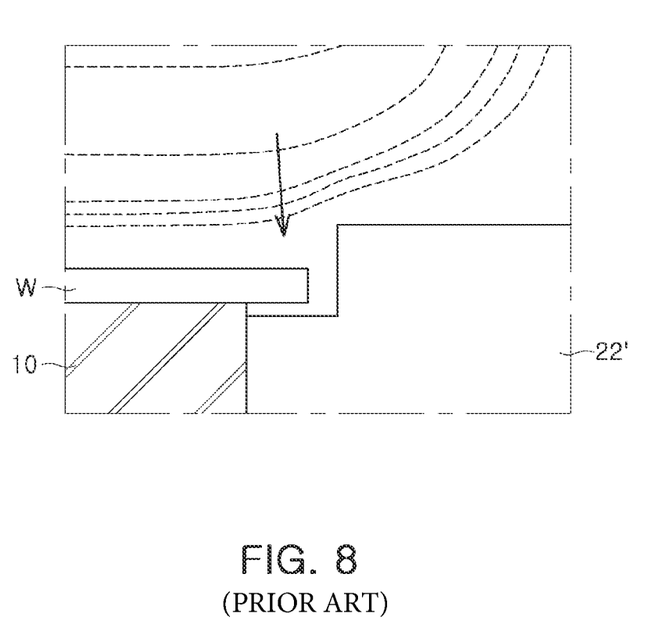

FIG. 8 illustrates a case in which a focus ring 22' according to a comparative example is used, and a simulation result for a state in which an etching depth of the focus ring 22' is 0 mm, for example, an initial state of the focus ring 22'. Equipotential lines indicated by dotted lines may be distorted and unevenly formed near the focus ring 22', and may not be parallel to an upper surface of a wafer W at an edge portion of the wafer W. As a result, ions incident on the edge portion of the wafer W may be incident at an angle of about (−) 0.9 degrees.

Figure 9:
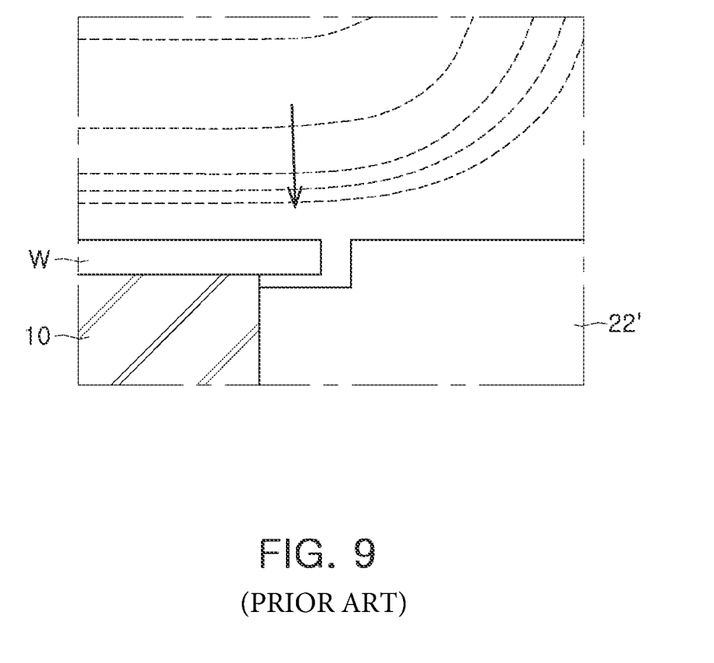

FIG. 9 illustrates a case in which a focus ring 22' according to a comparative example is used, and a simulation result for a state in which an etching depth of the focus ring 22' is 0.9 mm. Although the focus ring 22' is etched so as not to distort equipotential lines indicated by dotted lines near the focus ring 22', comparing to in FIG. 8, the equipotential lines may still not be parallel to an upper surface of the wafer W on the edge of the wafer W. As a result, ions incident on the edge portion of the wafer W may be incident at an angle of about (−) 0.35 degrees.

According to an embodiment, even when the focus ring may be consumed in the plasma processing apparatus, the incident angle of the ions in the edge region of the wafer may be kept constant.

The various advantages and effects of the disclosure may not be limited to the above description, and can be more easily understood in the course of describing specific embodiments.

While example embodiments have been shown and described above, it will be apparent to those skilled in the art that modifications and variations could be made without departing from the scope of the disclosure as defined by the appended claims.

What is claimed is:

1. A plasma processing apparatus comprising:
a lower electrode configured to support a wafer on an upper surface of the lower electrode;
a focus ring surrounding an edge of the lower electrode; and
an edge ring below the focus ring,
wherein the focus ring comprises:
a lower region comprising a lower portion having a first cross-sectional width and an upper portion having a second cross-sectional width that is less than the first cross-sectional width, and
an upper region comprising a first layer and a second layer vertically stacked on the upper portion of the lower region of the focus ring,
wherein the lower portion of the lower region of the focus ring and the upper portion of the lower region of the focus ring have a first electrical conductivity,
wherein the second layer is on a level higher than a level of an uppermost surface of the lower electrode,
wherein the first layer, the second layer, and the upper portion of the lower region each comprises a first side surface that is perpendicular to an upper surface of the focus ring and a second side surface that is sloped with respect to the upper surface of the focus ring,
wherein the second side surface of the upper portion of the lower region is horizontally spaced apart from the lower electrode by a first distance,
wherein the second side surface of the first layer is horizontally spaced apart from the lower electrode by a second distance that is greater than the first distance, the first layer having a second electrical conductivity that is less than the first electrical conductivity of the upper portion of the lower region, and
wherein the second side surface of the second layer is horizontally spaced apart from the lower electrode by a third distance that is greater than the second distance, the second layer having a third electrical conductivity that is less than the second electrical conductivity of the first layer.

2. The plasma processing apparatus according to claim 1, wherein the first layer and the second layer comprise a same semiconductor material, and
wherein a dopant concentration of the second layer is smaller than a dopant concentration of the first layer.

3. The plasma processing apparatus according to claim 1, wherein the second cross-sectional width of the upper portion of the lower region of the focus ring is within the first cross-sectional width of the lower portion of the lower region of the focus ring, such that, in a cross-section, the focus ring has a double stepped shape with a first portion extending radially inward with respect to the lower electrode and a second portion extending radially outward with respect to the lower electrode.

4. The plasma processing apparatus according to claim 1, wherein a boundary between the lower portion of the lower region of the focus ring and the upper portion of the lower region of the focus ring is on a level lower than the level of the uppermost surface of the lower electrode.

5. The plasma processing apparatus according to claim 1, wherein the focus ring comprises silicon or silicon carbide.

6. The plasma processing apparatus according to claim 1, wherein an electrical conductivity of the upper region of the focus ring gradually increases from the second layer to the first layer.

7. The plasma processing apparatus according to claim 6, wherein the upper region of the focus ring comprises a semiconductor material, and
wherein a dopant concentration in the upper region of the focus ring gradually increases from the second layer to the first layer.

8. A plasma processing apparatus comprising:
a lower electrode configured to support a wafer on an upper surface of the lower electrode;
a focus ring surrounding an edge of the lower electrode; and
an edge ring below the focus ring,
wherein the focus ring comprises:
a lower region comprising a lower portion having a first cross-sectional width and an upper portion having a second cross-sectional width that is less than the first cross-sectional width, the lower portion and the upper portion having a first electrical conductivity, and
an upper region comprising a plurality of layers vertically stacked on the upper portion of the lower region of the focus ring,
wherein the plurality of layers comprise a first layer disposed on an upper surface of the upper portion of the lower region of the focus ring,
wherein the first layer and the upper portion of the lower region each comprises a side surface that is sloped with respect to an upper surface of the focus ring,
wherein the side surface of the upper portion of the lower region is horizontally spaced apart from the lower electrode by a first distance, and
wherein the side surface of the first layer is horizontally spaced apart from the lower electrode by a second distance that is greater than the first distance, the first layer having a second electrical conductivity that is less than the first electrical conductivity of the upper portion of the lower region.

9. The plasma processing apparatus according to claim 8, wherein a boundary between the lower portion of the lower region of the focus ring and the upper portion of the lower region of the focus ring is on a level lower than the level of an uppermost surface of the lower electrode.

10. The plasma processing apparatus according to claim 8, wherein an upper surface of the upper region is on a level higher than a level of the upper surface of the lower electrode.

11. The plasma processing apparatus according to claim 8, further comprising:
an insulation ring surrounding an outer peripheral surface of the focus ring and comprising an insulating material.

12. The plasma processing apparatus according to claim 11, wherein an upper surface of the edge ring is in contact with a lower surface of the focus ring and a portion of a lower surface of the insulation ring.

13. A plasma processing apparatus comprising:
a lower electrode configured to support a wafer on an upper surface of the lower electrode; and
a focus ring surrounding an edge of the lower electrode, wherein the focus ring comprises:
a lower region comprising a lower portion having a first cross-sectional width and an upper portion having a second cross-sectional width that is less than the first cross-sectional width, the lower portion and the upper portion having a first electrical conductivity, and
an upper region comprising a plurality of layers vertically stacked on the upper portion of the lower region of the focus ring,
wherein the plurality of layers comprise a first layer, a second layer, a third layer, and a fourth layer sequentially disposed from an upper surface of the upper portion of the lower region of the focus ring,
wherein the first layer, the second layer, the third layer, the fourth layer, and the upper portion of the lower region each comprises a side surface that is sloped with respect to an upper surface of the focus ring,
wherein the side surface of the upper portion of the lower region is horizontally spaced apart from the lower electrode by a first distance,
wherein the first layer is horizontally spaced apart from the lower electrode by a second distance that is greater than the first distance, the first layer having a second electrical conductivity that is less than the first electrical conductivity of the upper portion of the lower region,
wherein the second layer is horizontally spaced apart from the lower electrode by a third distance that is greater than the second distance, the second layer having a third electrical conductivity that is less than the second electrical conductivity of the first layer,
wherein the third layer is horizontally spaced apart from the lower electrode by a fourth distance that is greater than the third distance, the third layer having a fourth electrical conductivity that is less than the third electrical conductivity of the second layer, and
wherein the fourth layer is horizontally spaced apart from the lower electrode by a fifth distance that is greater than the fourth distance, the fourth layer having a fifth electrical conductivity that is less than the fourth electrical conductivity of the third layer.

14. The plasma processing apparatus according to claim 13, wherein a dopant concentration in the upper region of the focus ring is smaller than a dopant concentration in the lower region of the focus ring.

* * * * *